(12) United States Patent
Mukai et al.

(10) Patent No.: US 6,551,765 B1
(45) Date of Patent: Apr. 22, 2003

(54) COATING APPARATUS, DISCHARGE DEVICE, AND COATING METHOD

(75) Inventors: Kiichiro Mukai, Yokohama (JP); Akira Sato, Yokohama (JP); Katuyuki Soeda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/477,625

(22) Filed: Jan. 4, 2000

(30) Foreign Application Priority Data

Jan. 7, 1999 (JP) .............................. 11-001906

(51) Int. Cl.[7] .............................. G03C 1/74; G03C 1/76; B06B 1/06; B05D 1/02; B05D 3/14; B05C 11/02
(52) U.S. Cl. .................. 430/320; 430/3; 430/272.1; 427/600; 427/425; 427/421; 427/240; 118/52
(58) Field of Search .................. 430/3, 320, 272.1; 427/600, 425, 421, 240; 118/52

(56) References Cited

U.S. PATENT DOCUMENTS 5,849,435 A * 12/1998 Akram et al. .................. 430/3
5,935,331 A * 8/1999 Naka et al. .................. 118/52
6,066,575 A * 5/2000 Reardon et al. ............. 427/421

FOREIGN PATENT DOCUMENTS

JP    3-249623    11/1991
JP    3-266815    11/1991

* cited by examiner

*Primary Examiner*—Janet Baxter
*Assistant Examiner*—Sin J. Lee
(74) *Attorney, Agent, or Firm*—Oblon, Spivak, McClelland, Maier & Neustadt, P.C.

(57) ABSTRACT

A coating apparatus for forming a film on a surface of a substrate to be coated, comprises a holding table for holding the substrate to be coated, a discharge head, containing a coating solution and formed with a plurality of discharge holes at a portion thereof opposing the substrate to be coated, for discharging the coating solution, a fine-vibration plate for applying fine vibrations to discharge the coating solution and driving motor for driving the holding table and the discharge head relative to each other.

2 Claims, 3 Drawing Sheets

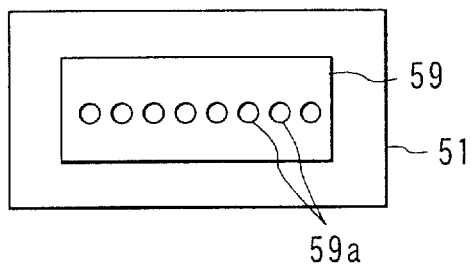
FIG. 7
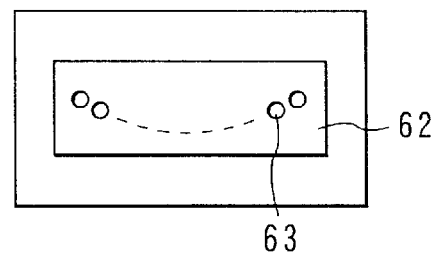
FIG. 9
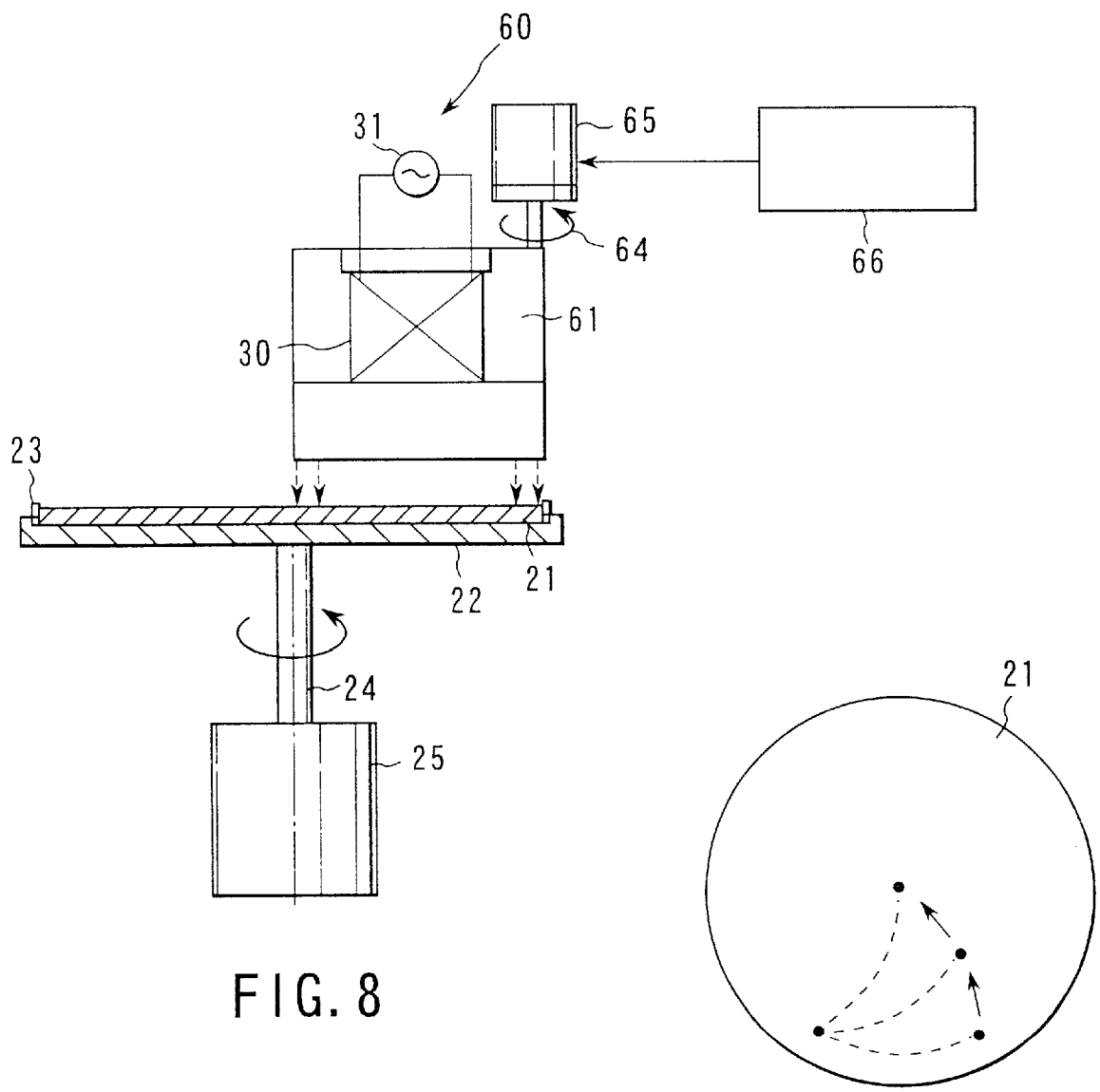
FIG. 8
FIG. 10

COATING APPARATUS, DISCHARGE DEVICE, AND COATING METHOD

BACKGROUND OF THE INVENTION

The present invention relates to a coating apparatus, for coating a substrate such as a semiconductor wafer or a glass substrate for a liquid crystal display device with resist, a heat resistant coating material, a liquid crystal or a polyimide used as an orienting film, as well as to a discharge means, and a coating method.

It is known to form a thin film on a substrate surface and to etch this thin film. For example, when forming a circuit pattern on a substrate such as a semiconductor wafer made of Si, a resist is applied to the substrate, and processes such as exposure, development, and etching are sequentially and repeatedly performed.

A resist is applied to the substrate generally by spin coating. In spin coating, the resist is dropped onto near the center of the substrate rotating at a high speed. The resist spreads over the entire surface of the substrate, and extra resist is removed as it is shaken off to the outside by the centrifugal force. This is how the resist is applied to the entire surface of the substrate.

In the above spin coating process, since the resist is shaken off to the outside by the centrifugal force, the resist is not utilized efficiently as the material. More specifically, in spin coating, the material utilization of the resist is as low as about 1% to 10%, and most of the resist is actually wastefully exhausted as a waste liquor.

In spin coating, a resist film also forms on the outer periphery of the substrate. As the substrate is transferred between the respective processes, its outer periphery is rubbed to produce resist dust. Hence, a solvent is applied to the outer periphery of the substrate by a nozzle to remove the resist film formed there. Accordingly, a process for removing the resist from the outer periphery is required, leading to a cumbersome operation.

BRIEF SUMMARY OF THE INVENTION

It is an object of the present invention to provide a coating apparatus, discharge means, and coating method with which a film having a uniform thickness can be formed and the material utilization is improved.

According to the present invention, there is provided a coating apparatus for forming a film on a surface of an object to be coated such as a substrate, comprising: holding means for holding the substrate; discharge means, containing a coating solution and formed with a plurality of discharge holes at a portion thereof opposing the object to be coated, for discharging the coating solution; fine-vibration means for applying fine vibrations to discharge the coating solution; and driving means for driving the holding means and the discharge means relative to each other.

According to the present invention, the coating solution is applied to the object to be coated by controlling its discharge amount by the fine-vibration means in accordance with fine vibration control while driving to rotate the object to be coated by the driving means. Thus, the coating solution can be applied to the object to be coated by uniforming its coating mount with the fine-vibration means. The coating operation is less limited by the shape of the surface of the object to be coated. Furthermore, the coating solution can be suppressed from being applied to a portion where coating is unnecessary.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a plain view showing a modification of the orifice plate built in the discharge head;

FIG. 8 is a side view showing the arrangement of a film coating apparatus according to the second embodiment of the present invention;

FIG. 9 is a view showing the pattern of orifice holes in a discharge head built in this coating apparatus; and FIG. 10 is a view showing the motion of an orifice hole when applying the resist to the substrate with this coating apparatus.

DETAILED DESCRIPTION OF THE INVENTION

The preferred embodiments of the present invention will be described with reference to the accompanying drawings.

Figure 1:
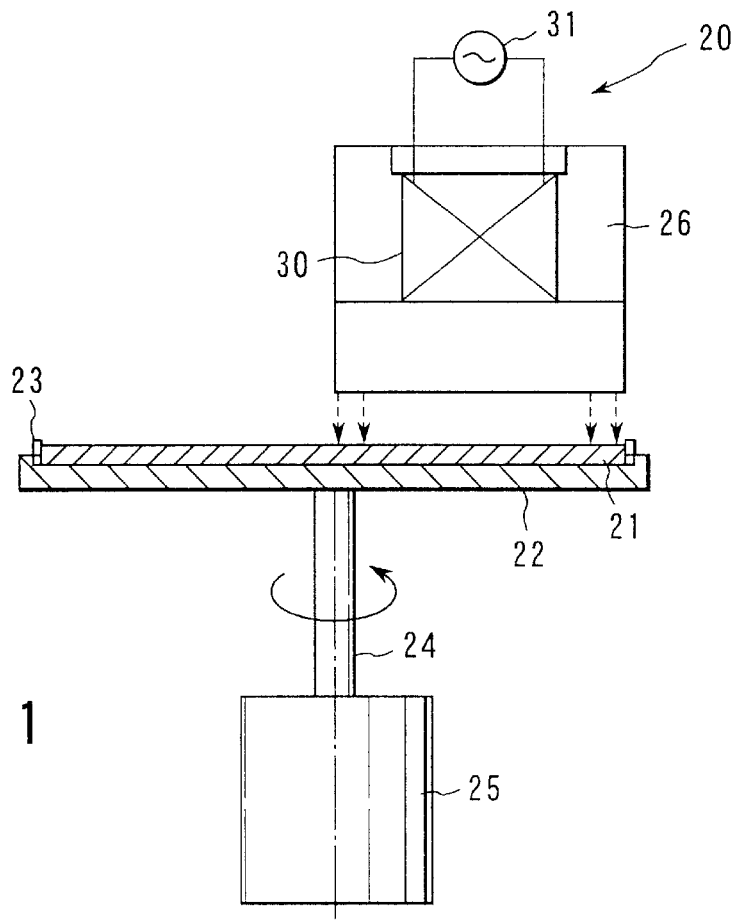
FIG. 1 is a side view showing the arrangement of a film coating apparatus according to the first embodiment of the present invention.

FIG. 1 is a side sectional view showing the arrangement of a coating apparatus 20 for a film according to the present invention. The coating apparatus 20 in this embodiment, which is for coating a substrate 21 such as a semiconductor wafer with a film such as a resist film, can also be used for coating a glass substrate for a liquid crystal display device with resist, a heat resistant coating material, a liquid crystal or a polyimide used as an orienting film.

The coating apparatus 20 has a holding table 22 for holding the substrate 21. A plurality of locking pins 23 are formed on the outer periphery of the holding table 22 to prevent removal of the substrate 21. The substrate 21 may be held not by the locking pins 23: the holding portion for the substrate 21 may be a recess, the wall surface of which prevents the substrate 21 from being removed.

A rotating shaft 24 is connected to the lower surface of the holding table 22, which is opposite to the upper surface where the substrate 21 is placed. The other end of the rotating shaft 24 opposite to the end connected to the holding table 22 is connected to a driving motor 25 serving as a driving means. The driving motor 25 drives to rotate the holding table 22, and can drive at a sufficiently low speed. Therefore, when the substrate 21 is rotated, the resist dropped onto the substrate 21 is not shaken off toward the outer periphery.

A discharge head (discharge means) 26 is located above the substrate 21 held by the holding table 22. The discharge head 26 has a sectional shape shown in FIGS. 2A and 2B. The discharge head 26 has a reservoir 27 for containing a predetermined amount of the resist.

A space 28 is formed in the discharge head 26, and is partitioned by a fine-vibration plate (fine-vibration means) 29 at a predetermined height to form the reservoir 27. The resist discharge side of the fine-vibration plate 29 as the boundary forms the reservoir 27. A piezoelectric element 30 (PZT) is provided to the opposite side of the resist discharge side.

The piezoelectric element 30 is fixed to the upper wall surface of the discharge head 26, and is adhered to the fine-vibration plate 29 on its resist discharge side. When a voltage is applied to the piezoelectric element 30, the fine-vibration plate 29 can directly reflect the fine vibration of the piezoelectric element 30.

Figure 4:
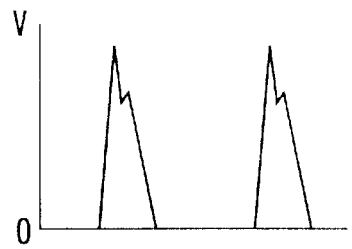
FIG. 4 is a graph showing a voltage applied from an external power supply to the coating apparatus.

As shown in FIG. 1, the piezoelectric element 30 is connected to an external power supply 31. The external power supply 31 generates a pulsed voltage. In other words, the external power supply 31 can apply the voltage pulse shown in FIG. 4 to the piezoelectric element 30.

An orifice plate 32 is attached to the resist discharge-side surface of the discharge head 26. The orifice plate 32 closes the resist discharge side of the reservoir 27 and enables discharge of a predetermined amount of resist.

Figure 2A:
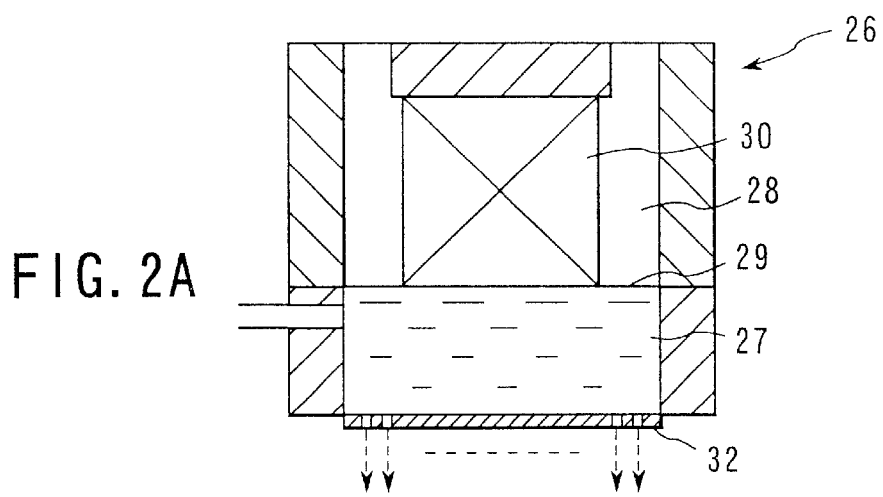
FIG. 2A is a longitudinal sectional view showing the arrangement of a discharge head built in the coating apparatus.
Figure 2B:
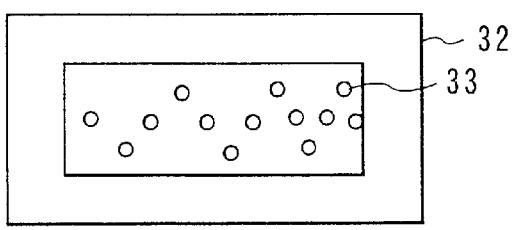
FIG. 2B is a plain view showing an orifice plate built in the discharge head.
Figure 3:
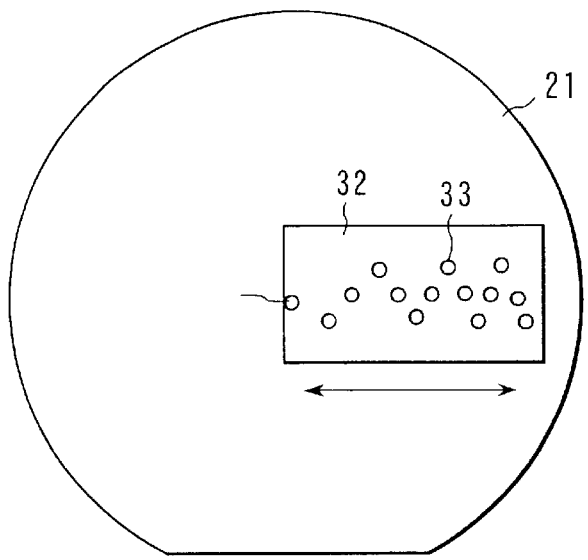
FIG. 3 is a view showing the pattern of orifice holes in the orifice plate when applying a resist to a substrate.

As shown in FIGS. 2A and 2B, and FIG. 3, the orifice plate 32 is formed with a large number of orifice holes 33 serving as discharge holes for discharging the resist. For example, about 200 to 300 orifice holes 33 are formed in the orifice plate 32. The orifice holes 33 have a small diameter so that they discharge the resist when the piezoelectric element 30 shrinks but usually do not leak the resist at all.

The orifice holes 33 have such a distribution that they are sparse on one end side of the orifice plate 32 and are dense on the other end side of the orifice plate 32, as shown in FIG. 3. One end side of the orifice plate 32 corresponds to a portion located at the center of the substrate 21, and the other end side thereof corresponds to a portion located at a radially outward-portion of the substrate 21. In other words, the farthest orifice hole 33 on one end side of the orifice plate 32 is aligned with the center of the substrate 21.

The density of orifice holes 33 increases proportionally from one end side toward the other end side of the orifice plate 32. Hence, the density of orifice holes 33 increases proportionally from the center of the substrate 21 in the radially outward direction.

The resist is not applied to the outer peripheral edge of the substrate 21. Hence, as shown in FIG. 3, when the farthest orifice hole 33 on the other end side of the orifice plate 32 is aligned with the center of the substrate 21, this orifice hole 33 has a predetermined gap (about several mm) from the outer peripheral edge of the substrate 21.

A method of applying a film by using the film coating apparatus 20 having the above arrangement will be described hereinbelow.

When applying a film of the resist to the substrate 21, the farthest orifice hole 33 on one end side of the orifice plate 32 is aligned with the center of the substrate 21. After alignment, the driving motor 25 is actuated to rotate the substrate 21 at a low speed.

The substrate 21 is rotatably driven in this manner, and simultaneously the piezoelectric element 30 is actuated to discharge the resist through the orifice holes 33. In this case, a voltage pulse is applied to the piezoelectric element 30 to instantaneously discharge the resist through the orifice holes 33, such that the resist once discharged from the orifice holes 33 is not returned.

The resist is dropped onto the substrate 21 for a predetermined period of time. When the substrate 21 is rotatably driven, its speed increases in proportion to the radius from the radially inner side of the substrate 21 toward the radially outer side thereof. Therefore, if the distribution of orifice holes 33 in the orifice plate 32 is set such that the number of orifice holes 33 increases proportionally from one end side of the orifice plate 32 toward the other end side thereof, when this one end side of the orifice plate 32 is aligned with the substrate 21, the resist is uniformly dropped onto the surface of the substrate 21.

The distribution of orifice holes 33 is set to be the distribution of appropriate constants of proportion in accordance with the rotational speed of the substrate 21.

The experimental result of the film coating method described above will be described.

In this experiment, a positive resist OFPR 800 manufactured by Tokyo Ohka was used as the resist, and the rotational speed of the semiconductor wafer (substrate 21) was set to 6 rpm. The resist was applied for 30 seconds.

As a result, a resist film having a thickness of $1\pm0.02\ \mu m$ was formed.

In this experiment, a material utilization of 90% or more was achieved.

Table 1 shows comparison between the film coating method according to the present invention and other film coating methods.

TABLE 1

| Method | Appropriate film thickness ($\mu m$) | Uniformity | Pattern formation | Utilization (%) of coating material | Limitation by shape | Appropriate viscosity (mPa · s) |
|---|---|---|---|---|---|---|
| Spray | 5–30 | Δ | X | 5–10 | Small | 10–100 |
| Spin | 1–10 | ○ | X | 0.1–5 | Large (Flat plate only) | 10–100 |
| Screen | 10–100 | ○ | ○ | 20–70 | Large | 10000 |
| Offset printing | 1–10 | ○ | ○ | 1–10 | Large | 10–50 |

TABLE 1-continued

| Method | Appropriate film thickness (μm) | Uniformity | Pattern formation | Utilization (%) of coating material | Limitation by shape | Appropriate viscosity (mPa · s) |
|---|---|---|---|---|---|---|
| Knife | 10–100 | Δ | X | 1–10 | Large (Flat plate only) | 10–100 |
| Wire | 10–100 | Δ | X | 1–10 | Large (Flat plate only) | 10–100 |
| Present invention | 1–30 | ⊙ | ⊙ | 70–95 | Small | 1–50 |

Table 1 shows respective data concerning the appropriate film thickness, the film uniformity, whether a pattern can be formed, the utilization of the coating material, the limitation on the shape formed on the substrate 21, and the appropriate viscosity of the respective methods. As symbols indicating the evaluation results of the respective methods, ⊙, ○, Δ, and X are used. The uniformity and the like degrade in this order.

The comparison results of the present invention with these methods are as follows. In the spray method, the appropriate film thickness is 5 μm to 30 μm. The uniformity is not good, and a pattern cannot be formed. The utilization of the coating material is about 5% to 10%. A large limitation is imposed on the shape. The appropriate viscosity is 10 mPa·s to 100 mPa·s.

In the spin coating method, the appropriate film thickness is 1 μm to 10 μm. The uniformity is marginally good. A pattern cannot be formed. The utilization of the coating material is 0.1% to 5%. A large limitation is imposed on the shape. The appropriate viscosity is 10 mPa·s to 100 mPa·s.

In the screen method, the appropriate film thickness is 10 μm to 100 μm. The uniformity is marginally good. A pattern can be formed marginally well. The utilization of the coating material is 20% to 70%. The shape imposes a large limitation. The appropriate viscosity is 10,000 mPa·s.

In the offset printing method, the appropriate film thickness is 1 μm to 10 μm. The uniformity is ordinarily good. A pattern can be formed marginally well. The utilization of the coating material is 1% to 10%. A large limitation is imposed on the shape. The appropriate viscosity is 10 mPa·s to 50 mPa·s.

In the knife method, the appropriate film thickness is 10 μm to 100 μm. The uniformity is not good. A pattern cannot be formed. The utilization of the coating material is 1% to 10%. A large limitation is imposed on the shape. The appropriate viscosity is 10 mPa·s to 100 mPa·s.

In the wire method, the appropriate film thickness is 10 μm to 100 μm. The uniformity is not good. A pattern cannot be formed. The utilization of the coating material is 1% to 10%. A large limitation is imposed on the shape. The appropriate viscosity is 10 mPa·s to 100 mPa·s.

As compared to these methods, in the coating method according to the present invention, the appropriate film thickness is 1 μm to 30 μm. The present invention is thus suitable for forming a thin film. The uniformity of the film of the resist is better than those of other methods. When compared to other methods, circuit pattern formation on the semiconductor wafer can be performed without any problem. The utilization of the coating material is very high, and the limitation imposed by the surface shape of the substrate 21 is small. The appropriate viscosity of the resist is 1 mPa·s to 50 mPa·s; a resist having a low viscosity can be used.

According to the coating apparatus 20 having the above arrangement, the resist is applied by vibration of the fine-vibration plate 29 while driving to rotate the substrate 21. The coating method of the coating apparatus 20 is thus superior to other methods in terms of uniformity, pattern formation, the utilization of the coating material, and the limitation imposed by the shape of the substrate 21. In fine, the resist can be applied to the substrate 21 well uniformly with a good utilization.

The distribution of density of orifice holes 33 formed in the orifice plate 32 increases proportionally from the farthest end in one end side toward the other end side of the orifice plate 32. Therefore, the coating solution can be discharged to the substrate 21 such that the film thickness of the coating solution becomes uniform in accordance with the distance from the center of the substrate 21.

In this case, the substrate 21 is rotated at a low speed. Even when the substrate 21 is rotated at a low speed in this manner, the coating solution can be uniformly discharged at any portion.

The coating solution is discharged by using the piezoelectric element 30. The coating amount of the coating solution can be controlled when finely vibrating the fine-vibration plate 29 by driving the piezoelectric element 30.

Since a voltage pulse is applied to the piezoelectric element 30, the discharge amount of the coating solution can be well adjusted by controlling the voltage pulse.

In the above arrangement, a single reservoir 27 is formed, and the coating solution reserved in the reservoir 27 is discharged toward the substrate 21. This arrangement is suitable when coating a large area with the coating solution. In this case, since one reservoir 27 is formed, the piezoelectric element 30 can also be one. This can simplify the arrangement.

Since the farthest orifice hole 33 on the other end side of the orifice plate 32 has a predetermined gap from the outer peripheral edge of the substrate 21, the coating solution is not applied to the edge cut portion on the outer peripheral edge of the substrate 21. Therefore, a conventionally required edge cut process becomes unnecessary, thus simplifying the method.

The first embodiment of the present invention has been described so far. Various modifications can be made in the present invention. These modifications will be described.

Figure 5:
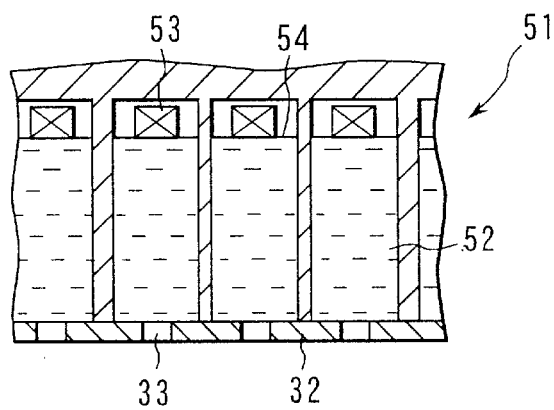
FIG. 5 is a longitudinal sectional view showing the arrangement of a modification of the discharge head.

In the above embodiment, only one reservoir 27 is provided. Alternatively, as in a discharge head (discharge means) 51 shown in FIG. 5, a plurality of reservoirs 52 may be formed in the discharge head 51, and the respective reservoirs 52 may be provided with piezoelectric elements 53 and fine-vibration plates 54. Obviously, a plurality of discharge holes 33 may be formed to correspond to the reservoirs 52.

Figure 6:
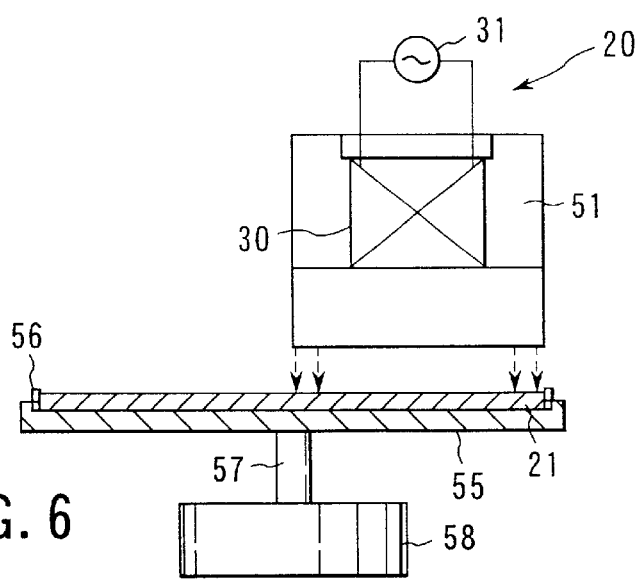
FIG. 6 is a side view showing the arrangement of a modification of the coating apparatus.

When the discharge head 51 is used, a holding table 55 may be used, as shown in FIG. 6, to drive the substrate 21 so as to slide relative to the discharge head 51. A plurality of locking pins 56 are formed on the outer periphery of the holding table 55 to prevent removal of the substrate 21. The substrate 21 may be held not by the locking pins 56. The holding portion for the substrate 21 may be a recess, the wall surface of which prevents the substrate 21 from being removed.

A driving shaft 57 is connected to the lower surface of the holding table 55 which is opposite to the upper surface where the substrate 21 is placed. The driving shaft 57 is connected to an XYθ driving table 58. The XYθ driving table 58 has a function of reciprocally moving the holding table 55 through the driving shaft 57 in X and Y directions that are perpendicular to each other in a horizontal plane, and a function of rotating the holding table 55 in a θ direction.

When the XYθ driving table 58 is used, the substrate 21 is driven to slide. The piezoelectric elements 53 are controlled separately and independently of each other. Only the piezoelectric elements 53 provided to the reservoirs 52 located above the substrate 21 are actuated.

As a result, the coating solution can be applied only in an amount corresponding to the width of the substrate 21, and the coating solution can be prevented from being discharged to the outside of the substrate 21 wastefully. Since the operation of the piezo-electric elements 53 is controlled, the coating solution is not applied to the edge cut portion on the outer peripheral edge of the substrate 21. Therefore, a conventionally required edge cut process becomes unnecessary, thus simplifying the method.

In addition to the arrangement of the above embodiment, a vibrating means for vibrating the substrate 21 may be provided to the driving motor 25. In this case, the substrate 21 is directly vibrated by the driving motor 25.

After the resist is applied-to the surface of the substrate 21, when the substrate 21 is vibrated by the vibrating means, the resist is evenly applied so that its film thickness is further uniformed.

Alternatively, as shown in FIG. 7, an orifice plate 59 formed with an array of orifice holes (discharge holes) 59a may be used in place of the orifice plate 32 of the discharge head 51. In this case, if the orifice plate 59 is combined with the XYθ driving table 58, the coating material can be applied to the substrate 21 even if the substrate 21 has a shape other than a circular plate.

A coating apparatus 60 according to the second embodiment of the present invention will be described with reference to FIGS. 8 to 10. In FIG. 8, portions having the same functions as those of FIG. 1 are denoted by the same reference numerals as in FIG. 1, and a detailed description thereof will be omitted.

The coating apparatus 60 of FIG. 8 is different from the first embodiment in the arrangement of orifice holes 63 formed in an orifice plate 62 of a discharge head 61. More specifically, the orifice holes 63 of the second embodiment are formed at an equal pitch, such that their array extending from one end side to the other end side forms a substantially arcuate shape, as shown in FIG. 9.

The orifice holes 63 are formed such that their array length is smaller than the diameter of the edge cut portion of the substrate 21. Accordingly, as shown in FIG. 10, when the center of the arcuate diameter of the array extending from one end side to the other end side is set to coincide with the center of the substrate 21, no orifice hole 63 is located at the edge cut portion.

The discharge head 61 can pivot about the orifice hole 63 at the farthest end side of the orifice plate 62 as the fulcrum.

To enable this pivot motion, the upper end of the discharge head 61 is connected to a rotating shaft 64, and the rotating shaft 64 is connected to a driving source 65. The driving source 65 is connected to a controller 66 so that the operation of the driving source 65 is controlled by it.

A coating method of coating the surface of the substrate 21 with a resist by using the coating apparatus 60 having the above arrangement will be described.

To coat the substrate 21 with a film of the resist, first, the center of the arcuate diameter of the array of orifice holes 63 is aligned to coincide with the center of the substrate 21. By this alignment, the array of orifice holes 63 is set at the boundary between the edge cut portion of the substrate 21 and the coating region of the coating solution.

After alignment is performed in this manner, the substrate 21 is driven to rotate at a predetermined speed (low-speed rotation is performed in this coating method). The piezoelectric element 30 is actuated to discharge the coating solution onto the surface of the substrate 21. Discharge of the coating solution is adjusted such that the respective orifice holes 63 discharge a uniform amount of coating solution.

When discharge of the coating solution is started, the driving source 65 is actuated simultaneously to drive the discharge head 61 to rotate. As shown in FIG. 10, the array of orifice holes 63 pivots about the orifice hole 63 at the farthest end of the orifice plate 62 as a fulcrum.

In this case, the moving speed of the orifice hole 63 at one end side increases, and accordingly this orifice hole 63 passes the center of the substrate 21 at a large moving speed. When the orifice holes 63 arranged in an arcuate shape discharge the same amount of coating solution, the amount of discharged coating solution decreases at the central side of the substrate 21.

In contrast to this, toward the radially outward portion of the substrate 21, the lower the moving speed of the orifice hole 63, the number of orifice holes 63 located at the central side of the substrate 21 becomes smaller than that of the orifice holes 63 located at the predetermined position, and the discharge amount of the coating solution increases. Hence, in the same manner as in the first embodiment described above, an arrangement can be realized in which the discharge amount of the coating solution is small at the central side of the substrate 21 and increases in the radially outward direction of the substrate 21.

This coating solution discharge is performed until the orifice hole 63 located at the farthest end of the orifice plate 62 reaches the center of the substrate 21. After that, the coating solution is discharged while swinging the coating apparatus 60 between the center of the substrate 21 and the boundary between the edge cut portion and the coating region.

When the film coating apparatus 60 having the above arrangement is used, the same function and effect as those of the first embodiment described above can also be obtained. In other words, the resist can be applied to the substrate 21 to have a uniform film thickness. The utilization of the material increases, and waste of the coating solution such as a resist can be prevented. Also, an edge cut process becomes unnecessary.

The second embodiment of the present invention has been described so far. Various modifications can be made in the present invention. These modifications will be described.

In the above embodiment, instead of using the single reservoir 27, a plurality of reservoirs 52 may be formed in the discharge head 61, and the respective reservoirs 52 may be provided with piezoelectric elements 53 and fine-vibration plates 54.

In this embodiment, the holding table 22 may be connected to a vibrating means, in the same manner as in the above embodiment. In this case, when the holding table 22 is vibrated by the vibrating means, the resist can be evenly applied to the surface of the substrate 21 more uniformly.

The first and second embodiments described above exemplify formation of a resist film. The present invention is not limited to this, but can be applied to, e.g., coating of liquid crystal display to a glass substrate for liquid crystal. Other than that, various changes and modifications may be made within a scope not departing from the spirit of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coating method comprising the steps of holding a semiconductor wafer;

positioning a discharge device in which discharge holes aligned to form an arc are formed so that a center of the arc coincides with a center of the semiconductor wafer;

containing a coating solution in said discharge device, vibrating a minute vibration device;

causing said discharge device to discharge the coating solution by vibrations of said minute vibration device;

rotating a wafer holding mechanism and said discharge device relatively to each other; and applying the coating solution while rotating said discharge device such that a discharge hole at one end of said discharge holes is fixed as a center of rotation and the other discharge holes are rotated around said center of rotation toward a center side of said semiconductor wafer, thereby causing a film of said coating solution to form on said semiconductor wafer.

2. A coating method according to claim 1, further comprising the step of vibrating said semiconductor wafer having said film of the coating solution formed thereon.

* * * * *